United States Patent [19]

Debiec et al.

[11] Patent Number: 5,449,955
[45] Date of Patent: Sep. 12, 1995

[54] FILM CIRCUIT METAL SYSTEM FOR USE WITH BUMPED IC PACKAGES

[75] Inventors: Richard P. Debiec, LaGrange Park, Ill.; Michael D. Evans, Wilmington, Mass.; Warren J. Pendergast, Ferrum, Va.

[73] Assignee: AT&T Corp., Murray Hill, N.J.

[21] Appl. No.: 221,731

[22] Filed: Apr. 1, 1994

[51] Int. Cl.6 ............... H01L 23/48; H01L 29/46; H01L 29/54; H01L 29/62
[52] U.S. Cl. ............... 257/751; 257/762; 257/763; 257/764; 257/766; 257/770
[58] Field of Search ............... 257/751, 762, 763–764, 257/766, 767, 770, 781; 427/125

[56] References Cited

U.S. PATENT DOCUMENTS

| | | | |
|---|---|---|---|
| 3,451,030 | 6/1969 | Garfinkel | 257/766 |
| 3,528,893 | 9/1970 | Christie et al. | 257/762 |
| 3,622,385 | 11/1971 | Stork | 257/762 |
| 3,781,596 | 12/1973 | Galli et al. | 257/762 |

FOREIGN PATENT DOCUMENTS 57-15432  1/1982  Japan ............... 257/766

*Primary Examiner*—Sara W. Crane
*Assistant Examiner*—John Guay
*Attorney, Agent, or Firm*—Oleg E. Alber

[57] ABSTRACT

A multilayer composite interconnection for use in circuits including thin film elements and electrical interconnections includes a copper barrier layer interposed between a nickel layer and a gold layer of the interconnection. The copper layer is in a thickness sufficient to bar or at least to restrict diffusion of nickel through the gold layer under processing and operating conditions. The interconnection multilayer composite interconnection includes in an ascending order, titanium, palladium or palladium-titanium alloy, copper, nickel, copper barrier and gold layers.

12 Claims, 4 Drawing Sheets

FILM CIRCUIT METAL SYSTEM FOR USE WITH BUMPED IC PACKAGES

TECHNICAL FIELD

The invention concerns thin film and hybrid integrated circuits with conduction systems for interconnecting elements in circuits, especially the circuits requiring connection to the elements by means of solder.

BACKGROUND OF THE INVENTION

Thin film and hybrid integrated circuits have extensive use in a variety of applications. A metal interconnection system widely used for such applications includes, in an ascending order from an insulating substrate, layers of titanium, palladium and gold. Titanium provides good adhesion to the insulating substrate, palladium provides good adhesion between titanium and gold layers. Gold layer which typically is approximately 5,000 nm thick acts as a primary conductor. This metal interconnection system was superseded by a metal composite including titanium, copper, nickel and gold layers. Here, a thick layer of copper is used as the primary conductor permitting the use of a much thinner gold layer, primarily on those areas of the circuit which are intended for soldering or bonding connection. Nickel oxide, which is formed on the nickel layer, is intended to act as a barrier to solder wetting any other areas of the circuit but the gold areas on the contact pads of the circuit. This composite may optionally include a layer of palladium or palladium-titanium alloy positioned between the titanium and copper layers. For example, see U.S. Pat. No. 4, 109,297 issued Aug. 22, 1978 to N. G. Lesh et al. or U.S. Pat. No. 5,288,951 issued Feb. 22, 1994 to R. P. Frankenthal et al., both of which are incorporated herein by reference.

An example of such a prior art metallization composite is shown in crossection in FIG. 6 of the drawings. The composite includes in an ascending order from a substrate, 61, a layer of titanium, 62, a layer of palladium or palladium-titanium alloy, 63, a layer of copper, 64, a layer of nickel, 65, and a layer of gold, 66. The gold layer may extend over the whole or a part of each metallization or only over terminal pads and bonding pads of the metallizations. This interconnection system is especially useful for soldering connection to other components of IC packages, especially to bumped IC units. Bumped IC units are being used for establishing leadless solder joints to terminal pads on the board. "Leadless solder joint" means that there are no flexible conduction leads or rigid pins on the IC unit for establishing a conductive path between contact pads on the IC unit and terminal pads on the board.

However, Ni diffuses through gold and onto its surface. Nickel and its compounds, such as nickel oxide, harden the gold and promote dewetting failures of soldered joints. Therefore, it is desirable to eliminate or at least reduce diffusion of nickel onto gold surface so as to have reliable solderable connection to the bumped IC units.

SUMMARY OF THE INVENTION

A multilayer composite interconnection for use in circuits including thin film elements and electrical interconnections includes a copper barrier layer interposed between a nickel layer and a gold layer of the interconnection. The copper layer is in a thickness sufficient to bar or at least to restrict diffusion of nickel through the gold layer under processing and operating conditions. The interconnection multilayer composite interconnection includes in an ascending order, titanium, palladium or palladium-titanium alloy, copper, nickel, copper barrier and gold layers.

DETAILED DESCRIPTION

Figure 1:
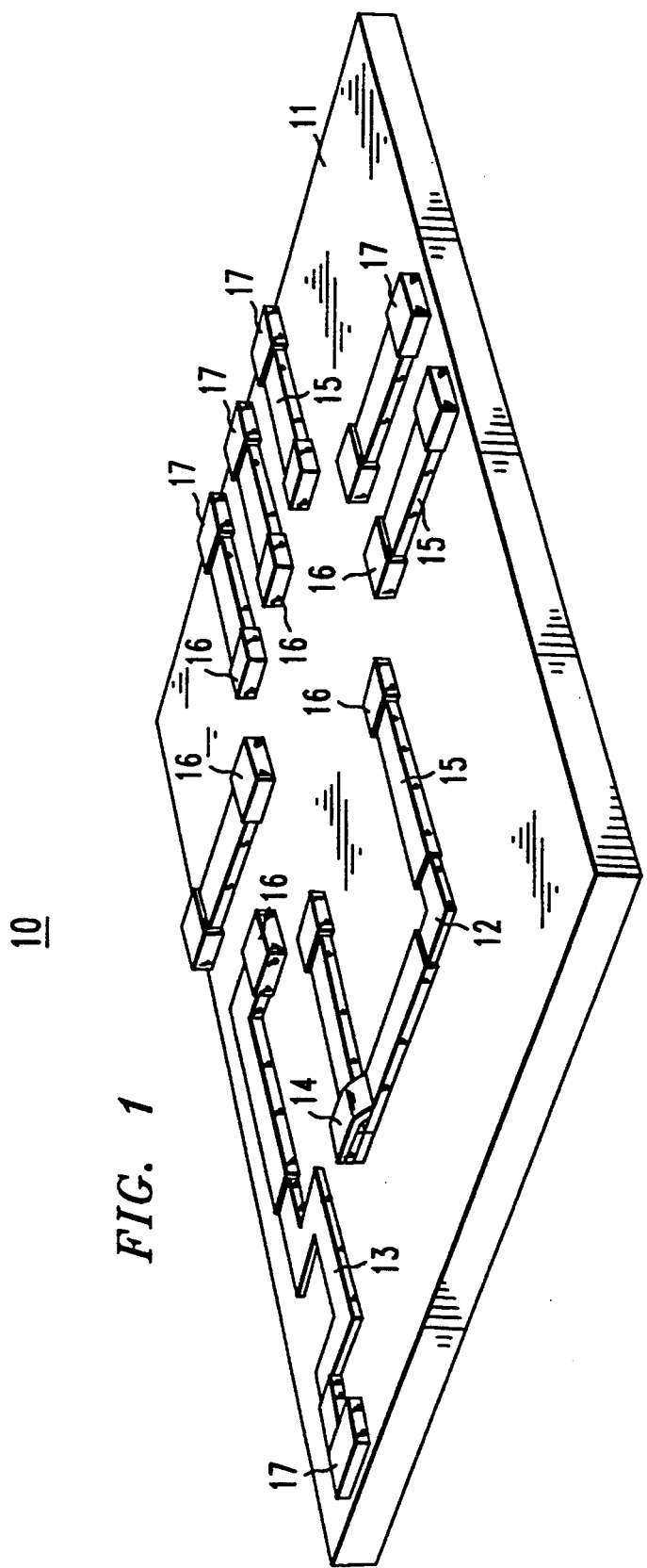
FIG. 1 is a schematic perspective view of an exemplary thin film circuit including conduction systems upon a non-conducting substrate.

In FIG. 1 is shown an example of a simple thin film and hybrid circuit, 10, prior to such circuit processing as resistor patterning, thermocompression bonding, soldering etc. This circuit is presented primarily for illustrative purposes and the suggested interconnect scheme may be utilized for a variety of circuits with obvious modifications.

Circuit 10, formed on a ceramic circuit board, 11, includes circuit elements, such as resistors, 12 and 13, and a capacitor, 14, interconnection conductors, 15, terminal pads, 16, and bonding pads, 17. Terminal pads 16, formed in the interior of board 11, define an area of the board where an IC package, such as an IC chip or module having contact pads, may be placed. Bonding pads 17 are formed near the edge of board 11 to permit connection of the circuit to elements off the board, by means of wires or tabs (not shown).

Figure 2:
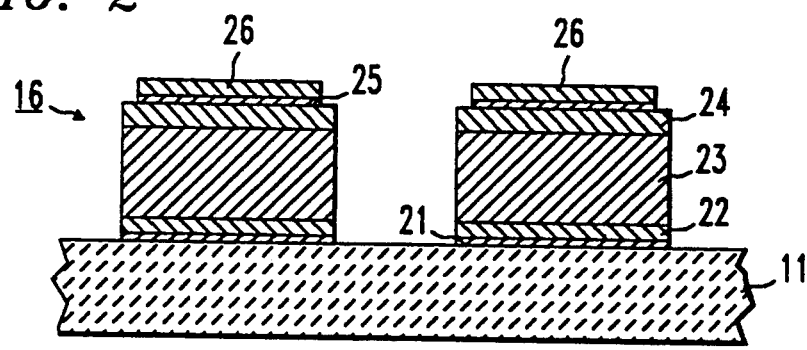
FIG. 2 is a crossection view of the metallization according to this invention.

The metallization composite, according to this invention, is shown in crossection in FIG. 2 of the drawings. Illustrated is a small portion of the circuitry shown in FIG. 1, including two terminal pads 16 on circuit board 11. Each pad includes in an ascending order from circuit board 11, a plurality of layers including a layer of titanium, 21, a layer of palladium or palladium-titanium alloy, 22, a layer of copper, 23, a layer of nickel, 24, a layer of copper barrier, 25, and a layer of gold, 26. The copper and gold layers, preferably, are deposited in the form of a disk or a square permitting formation of the solder joint on the gold after the solder bump melts during the reflow heating.

The sequence of steps to produce thin film circuit 10 preferably begins with the deposition of the resistor and capacitor elements, usually comprising tantalum or tantalum nitride, on an insulating substrate, which is most usually alumina. The formation of the interconnection scheme begins with a deposition of layer 21 of titanium over substantially the entire area of substrate 11. The thickness of titanium layer is within a range of from 100–400 nanometers (nm), preferably 250 nm. Next, a thin layer 22 of palladium in thickness of from 3 to 100 nm, preferably 50 nm, or a layer of palladium-titanium alloy in thickness of from 50 to 300 nm, preferably 100–150 nm, is deposited on the Ti layer. This is followed by deposition of a layer of Cu, about 300–700 nm, preferably 500 nm in thickness. These three layers are deposited preferably by particle deposition techniques such as electron beam evaporation or sputtering. Thereafter, the Cu layer is coated with a photoresist pattern, such as Shipley AZ-340B, in a pattern of the interconnection conductors. A thick layer of Cu is electroplated onto the Cu pattern exposed in the photoresist pattern forming Cu layer 23 up to a total Cu thickness ranging from 2,500 to 10,000 nm, preferably 3,500 nm. This is followed by electroplating a nickel layer 24 on top of copper layer 23 in a range of from 800–2,500 nm, preferably 1,000 nm, in thickness.

At this point in the processing, the photoresist layer was stripped off and another photoresist layer was applied, exposed and developed to expose only those areas of Ni which will be utilized for soldering terminal pads to contact pads on the IC units or for bonding pads. Cu barrier layer 25 is deposited on nickel layer 24 in thickness ranging from 200 to 1000 nm. Au layer 26 is then electroplated in thickness of 700–4,000 nm, preferably 2,000 nm, on top of this Cu barrier pattern. Since only those areas of nickel designated for terminal pads 16 and contact pads 17 and not the whole of the surface is plated with copper and gold, this leads to substantial savings in the use of gold. Copper barrier and gold am deposited on the nickel surface of each terminal pad such that an area of gold is surrounded by nickel. After the deposition of copper barrier and gold, exposed areas of nickel are oxidized to form a thin refractory layer of nickel oxide surrounding the gold area at each pad and extending along the conductors. The nickel oxide will act as a solder barrier, to avoid spreading of solder from the bumps on an IC package onto the nickel surface beyond the gold boundary.

The processing involves next a final patterning of the interconnect conductor by etching off those portions of the evaporated or sputtered Cu, Pd or PdTi alloy, and Ti layers which are not covered by the electroplated metal layers (Cu and Ni). Pd layer is removed by lift-off during etching of the Ti layer, while the PdTi alloy layer is etched off with the same etchant as the Ti layer. The various solutions for electro-plating Cu, Ni and Au layers and for etching Ni and Cu films and Ti layers are well known in the art. Examples of these solutions are disclosed in the before-mentioned U.S. Pat. No. 4,109,297 which is incorporated herein by reference. Deposition and etching of the PdTi alloy layer is further described in the before-mentioned U.S. Pat. No. 5,288,951 which is also incorporated herein by reference.

Figure 3:
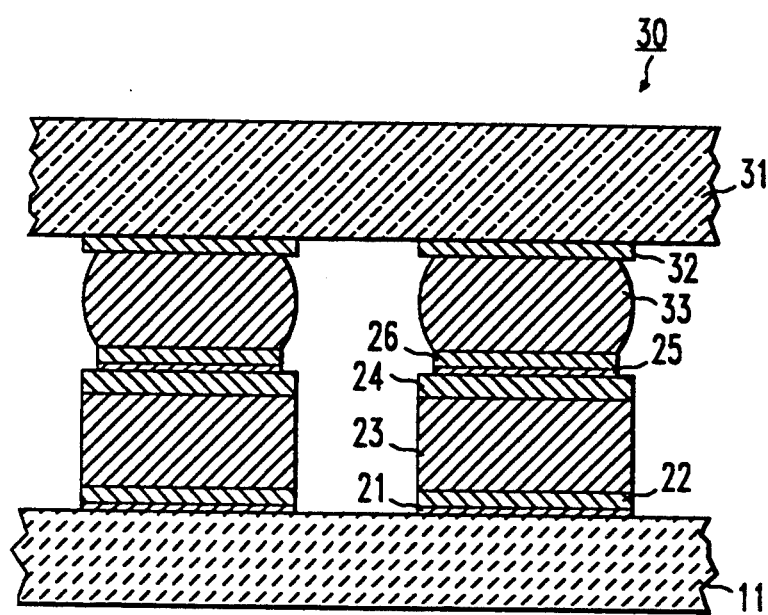
FIG. 3 is a crossection view of the metallization shown in FIG. 2 with a solder bumped IC unit mounted thereon.

The so-prepared circuits are then assembled with solder bumped IC units in a flip-chip attachment scheme. An IC unit, such as an IC chip or an IC module, provided with solder bumps on its flip side, is positioned on the interconnect pattern of the board so that bumps on the IC unit register with terminal pads 16 on the board. This assembly is heated to cause solder bonding of the IC unit to the pads on the board. Shown in FIG. 3 is a section of an assembly of the circuit shown in FIG. 2 with a bumped IC unit 30, including a device, 31, terminal pads, 32, and solder bumps, 33.

Figure 6:
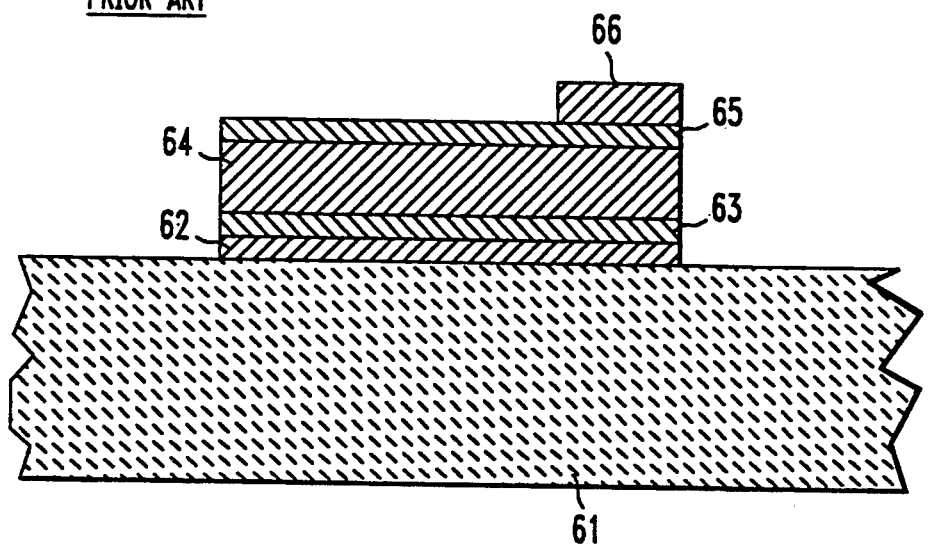
FIG. 6 is a crossection view of a prior art metallization.

The reason for placing a copper barrier between the nickel and gold layers may be explained as follows. It has been discovered that nickel and its products, such as nickel oxides, tend to migrate into the gold layer of the metallization shown in FIG. 6 and onto gold surface so as to appear at the interface between the gold and the solder. Presence of as little as 5 atomic percent and less of nickel on the gold surface, detrimentally affects the solderability of the surface. Nickel hardens the gold and nickel oxides interfere with soldering and bonding by promoting dewetting failures of soldered joints. Besides, nickel oxides are difficult to remove with conventional acidic cleaning. Furthermore, conversion of nickel to nickel oxides, during subsequent processing or in use, tends to weaken the solder bond resulting in contact failure.

To eliminate or, at least, to reduce the adverse effects of nickel and its products on the interface between gold and solder surfaces, Cu diffusion barrier 25 is introduced between nickel layer 24 and gold layer 26. The Cu diffusion barrier is deposited on the nickel prior to the deposition of Au. Cu may be deposited in the same pattern as the gold pattern. Cu is electroplated on Ni surface in thickness ranging from 200 to 1,000 nm, in the thickness sufficient to prevent interdiffusion of Ni into and onto the gold layer. Alternatively, the copper barrier may be deposited on the nickel layer by such particle deposition as sputtering or ion beam deposition.

The exclusion of oxides, other than copper oxide on the gold surface, is facilitated by forming a gold ordered system through heat treatment at temperatures ranging from 250° C. to 350° C. degrees centigrade. A heat-treatment which is a part of the process of forming the hybrid IC circuit, such as the 300° C., 4 hour heat treatment process used for metal film stabilization, may be used for forming the ordered system, also. As a result of the heat treatment, Cu diffuses into the gold layer causing ordering of the gold film. This gold film resists the diffusion of nickel into the gold film, so that no nickel is found at the surface of the gold layer after the heat treatment. Cu provides immunity from Ni related failures while providing suitable thermal resistance in the film system to passivate resistors and to interdiffuse the remaining metallization layer. Any copper oxide formed during the thermal processes preceding solder bonding of IC units to the board, is readily cleaned in mineral acid solutions. The cleaning of copper oxide, using dilute sulfuric acid (about 1M), removes surface contaminants without significantly changing the nickel oxide that is required as a barrier for the containment of solder at a device attachment site.

Figure 4:
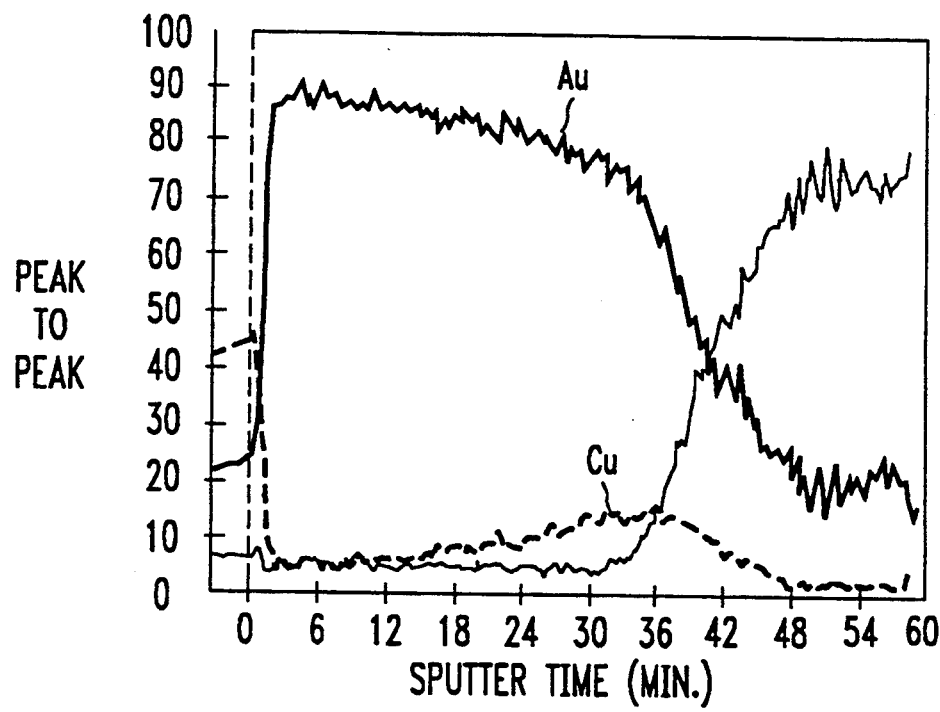
FIG. 4 is a plot of an Auger depth profile of a typical specimen according to the invention.

In FIG. 4 is shown a plot of Auger depth profile testing of the terminal pad according to this invention. Virtually no nickel is found at the surface. It is seen, that only gold is removed from the pad with a small amount of copper, and with even smaller amount of nickel for an extended period of etching by sputtering. Only after the gold and copper are removed substantially, nickel is being increasingly removed from the underlaying nickel surface.

Figure 5:
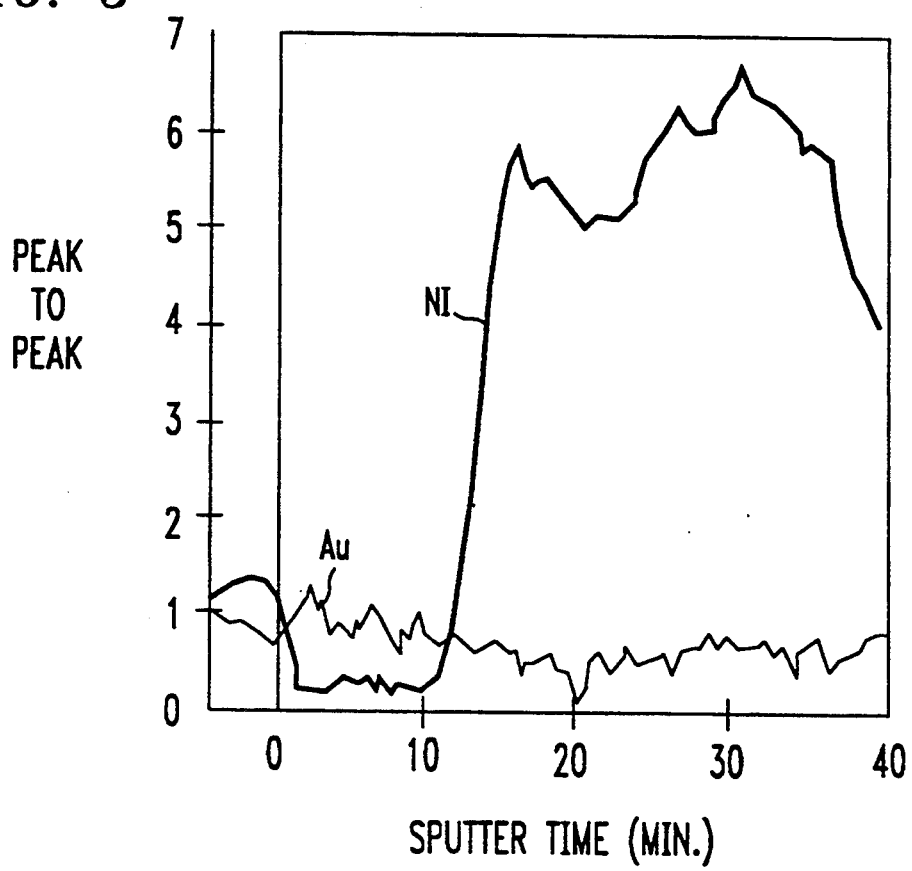
FIG. 5 is a plot of an Auger depth profile of a typical prior art conduction system with Ni-contaminated Au surface.

In FIG. 5 is shown a plot of Auger depth profile testing of a prior art metallization composite in which gold is directly upon the nickel layer. There is a high surface incidence of nickel found. It is seen that while gold concentration remains relatively steady, throughout the sputtering time, the concentration of nickel rises drastically after only a short period and quickly supersedes the concentration of gold.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A circuit including thin film elements and electrical interconnections on the major surface of an insulating substrate, said interconnections comprising a plurality of metal layers deposited on said substrate in a preselected pattern, said plurality of metal layers comprises in an ascending order from the substrate titanium, palladium or a palladium-titanium alloy, copper nickel and gold, wherein a thin barrier layer of copper is interposed between the gold layer and the nickel layer, said thin barrier layer of copper being in a thickness sufficient to restrict diffusion of nickel through said gold layer.

2. The circuit of claim 1 in which said copper barrier layer ranges from 200 to 1,000 nanometers in thickness.

3. The circuit of claim 1 in which said copper barrer layer is 200 nanometers thick.

4. The circuit of claim 1 in which said titanium layer is form 100 to 400 nm, said palladium layer is from 3 to 100 nm, said palladium titanium alloy layer is from 50 to 300 nm, said copper layer is from 2,500 to 10,000 nm, said nickel layer is from 800 to 2,500 nm, said copper barrier layer is from 200 to 1000 nm, and said gold layer is from 700 to 4,000 nm.

5. The circuit of claim 1 which said Ti layer is 250 nm thick, said Pd is 50 nm thick, said Pd-Ti alloy layer is 100–150 nm thick, said copper layer is 3,500 nm thick, said Ni layer is 1,000 nm thick, said copper barrier layer is 200 nm thick, and said Au layer is 2,000 nm thick.

6. The circuit of claim 1 in which said gold preferably overlays those areas of each interconnection which are to be used for soldering contacts or bonding conductors thereto, and in which those of laterally extending portions of the Ni layer which are not covered with Au, are provided on purpose with nickel oxide coating.

7. A composite electrical interconnection for use in circuits including thin film elements and electrical interconnections on the major surface of an insulating substrate, said interconnection comprising a plurality of metal layers deposited on said substrate in a preselected pattern said plurality of metal layers comprises in an ascending order from the substrate titanium, palladium or a palladium-titanium alloy, copper, nickel and gold, wherein a thin barrier layer of copper is interposed between the gold layer and the nickel layer, said thin barrier layer of copper being in a thickness sufficient to bar diffusion of nickel through said gold layer.

8. The interconnection of claim 7 in which said gold layer preferably overlays those areas of said interconnections which are to be used for soldering contacts or bonding conductors thereto, and in which those of laterally extending portions of the Ni layer, which are not covered with Au, are provided on purpose with nickel oxide coating.

9. The interconnection of claim 7 in which said copper barrier layer ranges from 200 to 1,000 nanometers in thickness.

10. The interconnection of claim 7 in which said copper barrer layer is 200 nanometers thick.

11. The interconnection of claim 7 in which said titanium layer is form 100 to 400 nm, said palladium layer is from 3 to 100 nm, said palladium titanium alloy layer is from 50 to 300 nm, said copper layer is from 2,500 to 10,000 nm, said nickel layer is from 800 to 2,500 nm, said copper barrier layer is from 200 to 1000 nm, and said gold layer is from 700 to 4,000 nm.

12. The interconnection claim 7 in which said Ti layer is 250 nm thick, said Pd is 50 nm thick, said Pd-Ti alloy layer is 100–150 nm thick, said copper layer is 3,500 nm thick, said Ni layer is 1,000 nm thick, said copper barrier layer is 200 nm thick, and said Au layer is 2,000 nm thick.

* * * * *